(12) United States Patent
Wu et al.

(10) Patent No.: US 12,438,060 B2
(45) Date of Patent: Oct. 7, 2025

(54) CHIP PACKAGE AND METHOD OF MANUFACTURING THE SAME

(71) Applicant: Unimicron Technology Corp., Taoyuan (TW)

(72) Inventors: Cheng-Hui Wu, New Taipei (TW); Jeng-Ting Li, Pingtung County (TW); Ping-Tsung Lin, Miaoli County (TW); Kai-Ming Yang, Hsinchu County (TW); Pu-Ju Lin, Hsinchu (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 766 days.

(21) Appl. No.: 17/453,489

(22) Filed: Nov. 4, 2021

(65) Prior Publication Data

US 2022/0068742 A1 Mar. 3, 2022

Related U.S. Application Data

(63) Continuation-in-part of application No. 17/086,475, filed on Nov. 2, 2020, now Pat. No. 11,824,012.

(30) Foreign Application Priority Data

Aug. 27, 2020 (TW) .................................. 109129326
Aug. 25, 2021 (TW) .................................. 110131532

(51) Int. Cl.
*H01L 23/31* (2006.01)
*H01L 21/56* (2006.01)
(Continued)

(52) U.S. Cl.
CPC .......... *H01L 23/3114* (2013.01); *H01L 21/56* (2013.01); *H01L 23/49838* (2013.01);
(Continued)

(58) Field of Classification Search
CPC .......... H01L 23/3114; H01L 23/49838; H01L 24/11; H01L 24/14; H01L 2224/1701
See application file for complete search history.

(56) References Cited

U.S. PATENT DOCUMENTS

2019/0051607 A1\* 2/2019 Suk ..................... H01L 23/5383
2019/0057941 A1\* 2/2019 Mescher ............. H01L 23/3675
2021/0159191 A1 5/2021 Lin et al.

FOREIGN PATENT DOCUMENTS

KR 20150104467 A \* 9/2015
TW I609468 B 12/2017
(Continued)

*Primary Examiner* — Mohammad M Choudhry
(74) *Attorney, Agent, or Firm* — CKC & Partners Co., LLC

(57) ABSTRACT

A chip package includes a redistribution layer, a chip, and an encapsulation member. The redistribution layer includes an insulation part, a plurality of first pads and a plurality of second pads, where the insulation part has a first surface, a second surface opposite to the first surface, and a side surface between the first surface and the second surface. The first pads and the second pads are located at the first surface and the second surface respectively. The chip is disposed on the first surface and electrically connected to the first pads. The encapsulation member wraps the chip and the redistribution layer, and covers the first surface and the side surface, where the encapsulation member exposes the second pads, and the encapsulation member is not flush with the first surface and the side surface.

14 Claims, 14 Drawing Sheets

(51) Int. Cl.
    *H01L 23/00*         (2006.01)
    *H01L 23/498*        (2006.01)
(52) U.S. Cl.
    CPC .............. *H01L 24/11* (2013.01); *H01L 24/14* (2013.01); *H01L 2224/1701* (2013.01); *H01L 2224/17104* (2013.01)

(56) References Cited

FOREIGN PATENT DOCUMENTS

| | | |
|---|---|---|
| TW | 201810459 A | 3/2018 |
| TW | 202129775 A | 8/2021 |

* cited by examiner

CHIP PACKAGE AND METHOD OF MANUFACTURING THE SAME

CROSS-REFERENCE TO RELATED APPLICATION

This application is a Continuation-in-part of U.S. application Ser. No. 17/086,475 filed Nov. 2, 2020, which claims priority to Taiwan Application Serial Number 109129326 filed Aug. 27, 2020, and the application also claims priority to Taiwan Application Serial Number 110131532 filed Aug. 25, 2021, while all of which are herein incorporated by reference in their entireties.

BACKGROUND

Technical Field

The present disclosure relates to a chip package and a method of manufacturing the same. More particularly, the present disclosure relates to a chip package including a redistribution layer (RDL) and a method of manufacturing the same.

Description of Related Art

After a conventional chip package is complete, a series of reliability tests will be performed to the conventional chip package, so as to ensure the quality of the chip package. The current reliability tests include a thermal cycling test (TCT). During the TCT, the chip package is placed in an environment with temperature extremes. For example, the chip package can be placed in an environment with temperature extremes between −55° C. and +125° C. for testing. Hence, the finished chip package needs enough strength of structure to withstand the TCT, to ensure the quality in the reliability of the chip package.

SUMMARY

At least one embodiment of the disclosure provides a chip package which employs an encapsulation member wrapping the chip and the redistribution layer to improve the reliability.

At least one embodiment of the disclosure provides a method of manufacturing the previous chip package.

A chip package according to at least one embodiment of the disclosure includes a redistribution layer, a chip, and an encapsulation member. The redistribution layer includes an insulation part, a plurality of first pads, and a plurality of second pads, in which the insulation part has a first surface, a second surface opposite to the first surface, and a side surface between the first surface and the second surface. The first pads and the second pads are located at the first surface and the second surface respectively. The chip is disposed on the first surface and electrically connected to the first pads. The encapsulation member wraps the chip and the redistribution layer and covers both the first surface and the side surface. The encapsulation member exposes the second pads, and the encapsulation member is not flush with the first surface and the side surface.

A method of manufacturing a chip package according to at least one embodiment of the disclosure includes the following steps. First, an initial redistribution layer is formed on a support substrate. Afterward, a plurality of chips are mounted on the initial redistribution layer. Afterward, the initial redistribution layer is diced into a plurality of redistribution layers separated from each other, where a plurality of trenches are formed among the redistribution layers. Afterward, an encapsulation member is formed, in which the encapsulation member wraps the chip and the redistribution layer and fills the trenches. The support substrate is removed. Afterward, the encapsulation member is diced along the trenches.

Based on the above, since the encapsulation member wraps the chip and the redistribution layer and covers both the first surface and the side surface of the redistribution layer, the encapsulation member can enhance the structure of the chip package to improve the reliability of the chip package, so that the chip package can have enough strength of structure to withstand the TCT.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
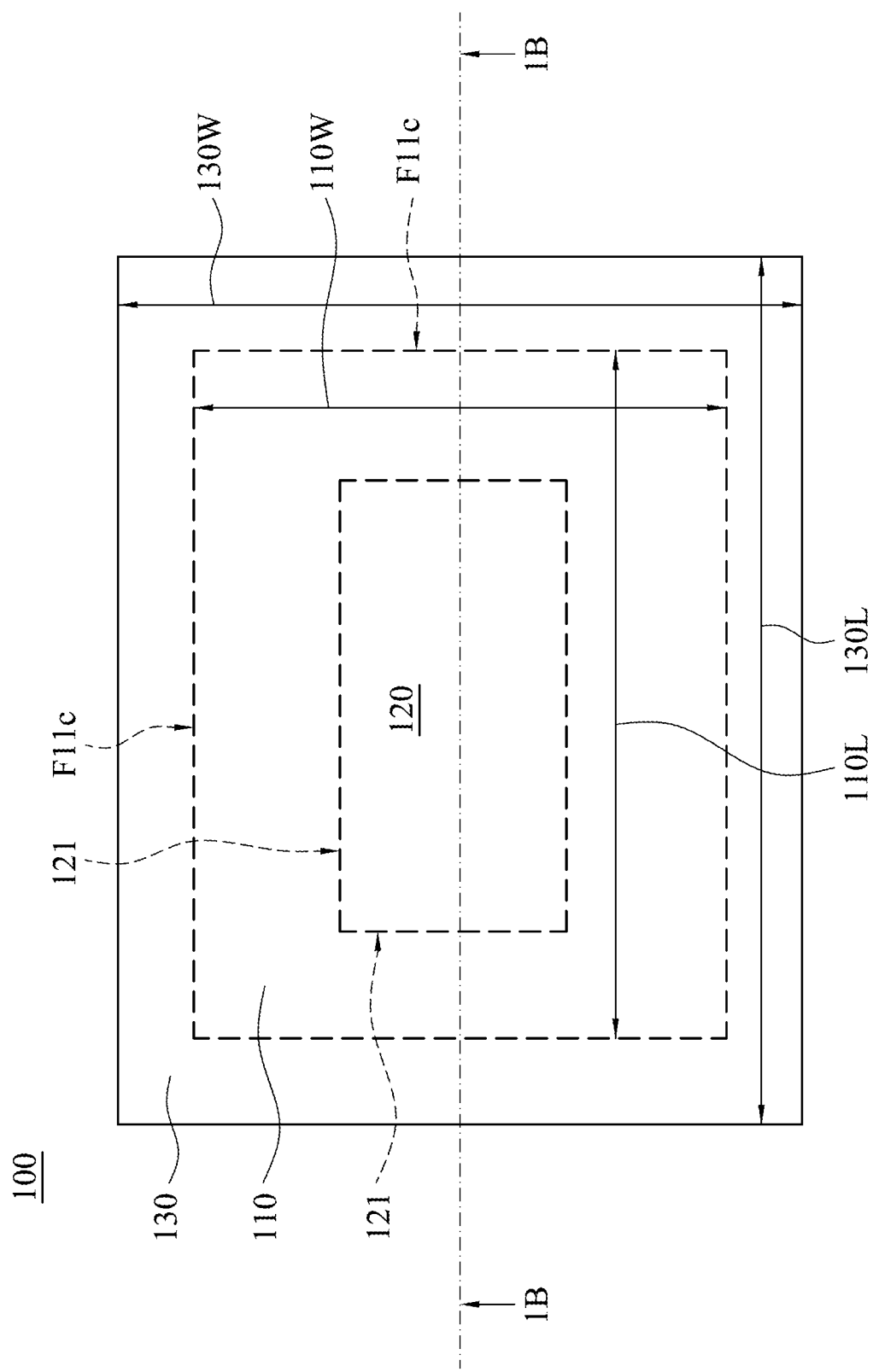
FIG. 1A is a schematic top view of a chip package according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions. Accordingly, the description and explanation of the following embodiments are not limited to the sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 1B:
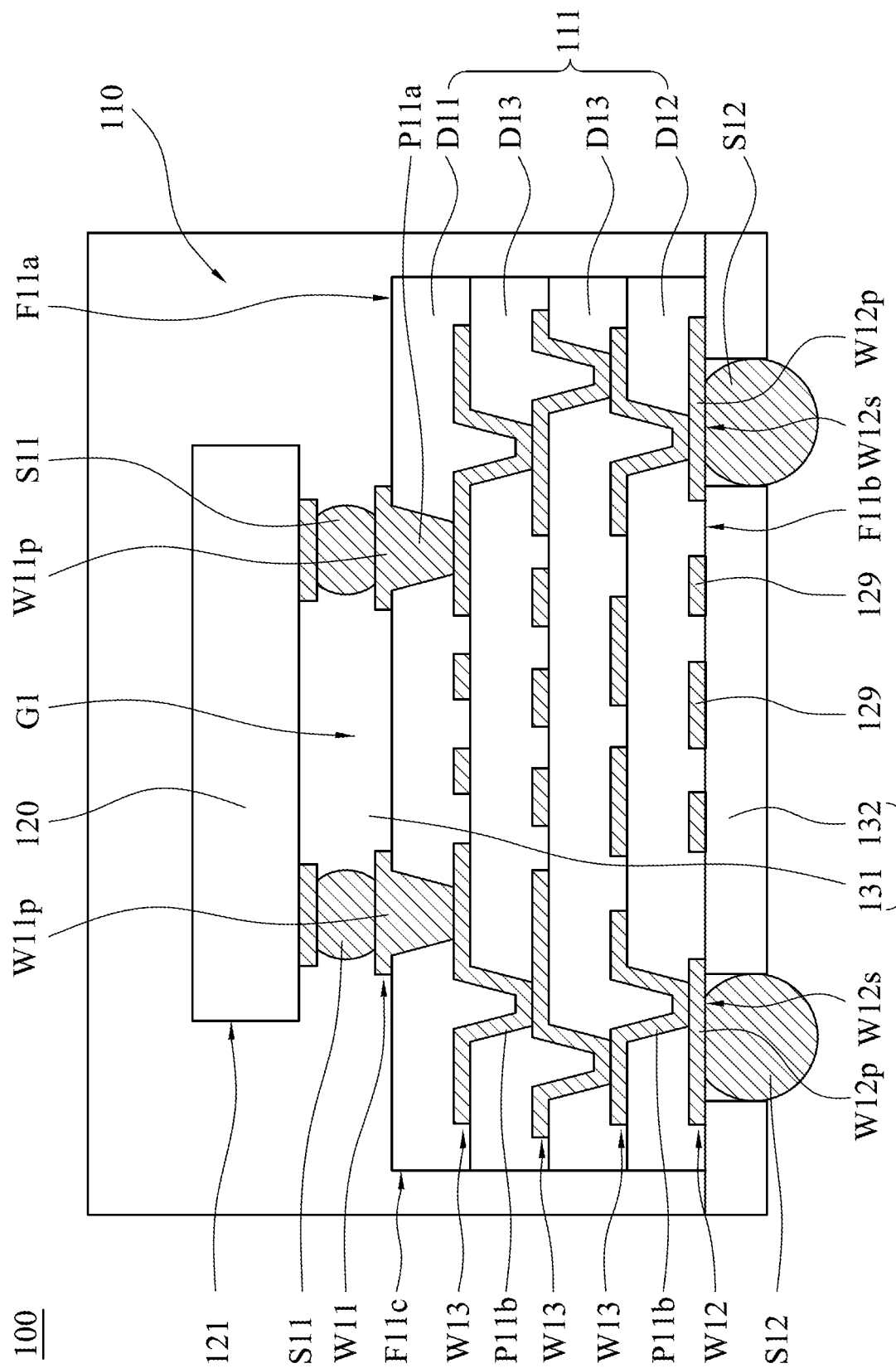
FIG. 1B is a schematic cross-sectional view along a line 1B-1B shown in FIG. 1A.

FIG. 1A is a schematic top view of a chip package according to at least one embodiment of this disclosure, and FIG. 1B is a schematic cross-sectional view along a line 1B-1B shown in FIG. 1A. Referring to FIG. 1A and FIG. 1B, a chip package 100 includes a redistribution layer 110. The redistribution layer 110 includes an insulation part 111, where the insulation part 111 has a first surface F11a, a second surface F11b opposite to the first surface F11a, and a side surface F11c located between the first surface F11a and the second surface F11b.

In the present embodiment, the first surface F11a and the second surface F11b can be the upper surface and the lower surface of the insulation part 111 respectively, and the side surface F11c can take the shape of a ring and extend along the edges of both the first surface F11a and the second surface F11b. In addition, the side surface F11c can be the part of the outer edge of the redistribution layer 110. In the embodiment as shown in FIG. 1A, the side surface F11c can loop to form a rectangle and have four sides (not labeled). The length 110L of the redistribution layer 110 is the distance between two opposite sides, whereas the width 110W of the redistribution layer 110 is the distance between the other two opposite sides.

The insulation part 111 can have a multilayer structure. For example, the insulation part 111 can include a first outer insulation layer D11, a second outer insulation layer D12 and a plurality of inner insulation layers D13. The inner insulation layers D13 are located between the first outer insulation layer D11 and the second outer insulation layer D12, while the first outer insulation layer D11, the second outer insulation layer D12 and the inner insulation layers D13 are stacked. The first outer insulation layer D11 has the first surface F11a, whereas the second outer insulation layer D12 has the second surface F11b.

The materials of the first outer insulation layer D11, the second outer insulation layer D12, and the inner insulation layers D13 can be the same. In the present embodiment, all of the first outer insulation layer D11, the second outer insulation layer D12, and the inner insulation layers D13 can be made of photo imageable dielectric (PID) material or other insulation material, such as Ajinomoto build-up film (ABF) resin or polypropylene (PP). In addition, in other embodiment, the materials of at least two of the first outer insulation layer D11, the second outer insulation layer D12, and the inner insulation layer D13 can be different.

The redistribution layer 110 can further include a first outer wiring layer W11, a second outer wiring layer W12 and a plurality of inner wiring layers W13, where the inner wiring layers W13 are located between the first outer wiring layer W11 and the second outer wiring layer W12. Each of the first outer wiring layer W11 and the second outer wiring layer W12 has a plurality of pads. Taking FIG. 1B for example, the first outer wiring layer W11 includes a plurality of first pads W11p, whereas the second outer wiring layer W12 includes a plurality of second pads W12p.

At least one of the first outer wiring layer W11 and the second outer wiring layer W12 can further include a trace. For example, in the embodiment as shown in FIG. 1B, the second outer wiring layer W12 can further include a plurality of traces 129, whereas the first outer wiring layer W11 includes the first pads W11p only and no trace. Moreover, in other embodiment, the first outer wiring layer W11 also can include a plurality of traces, whereas the second outer wiring layer W12 can include no trace. Hence, FIG. 1B does not limit the first outer wiring layer W11 and the second outer wiring layer W12 including any trace apiece. In addition, in the present embodiment, each of the inner wiring layers W13 can include a plurality of traces (not labeled) and a plurality of pads (not labeled).

Each of the inner wiring layers W13 is located between adjacent two of the first outer insulation layer D11, the second outer insulation layer D12 and the inner insulation layers D13. In FIG. 1B, the upper inner wiring layer W13 can be located between the first outer insulation layer D11 and the inner insulation layer D13 which are adjacent to each other, whereas the lower inner wiring layer W13 can be located between the second outer insulation layer D12 and the inner insulation layer D13 which are adjacent to each other. The middle inner wiring layer W13 can be located between two adjacent inner insulation layers D13.

The first outer wiring layers W11 are located at the first outer insulation layer D11, while the second outer wiring layers W12 are located at the second outer insulation layer D12. It is necessary to note that the first outer wiring layer W11 located at the first outer insulation layer D11 means that the first outer wiring layer W11 in FIG. 1B can be located on or above the first outer insulation layer D11, or the first outer wiring layer W11 can be located in the first outer insulation layer D11. Likewise, the second outer wiring layer W12 located at the second outer insulation layer D12 means that the second outer wiring layer W12 in FIG. 1B can be located on or below the second outer insulation layer D12, or the second outer wiring layer W12 can be located in the second outer insulation layer D12.

In the embodiment as shown in FIG. 1B, the first outer wiring layer W11 is located on the first surface F11a of the first outer insulation layer D11, whereas the second outer wiring layer W12 is located in the second outer insulation layer D12 and does not substantially protrude from the second surface F11b. Hence, the first pads W11p at the first surface F11a can be located on the first surface F11a and protrude from the first surface F11a, whereas the second pads W12p at the second surface F11b can be located in the second surface F11b, where the second surface F11b can be flush with the out surface W12s of each of the second pads W12p, as shown in FIG. 1B.

In addition, the redistribution layer 110 can further include a plurality of conductive connection structures P11a and P11b, where the conductive connection structures P11a and P11b are located in the insulation part 111. Taking FIG. 1B for example, the conductive connection structures P11a can be located in the first outer insulation layer D11, and the conductive connection structures P11b can be located in the second outer insulation layer D12 and the inner insulation layers D13. Moreover, since all of the first outer insulation layer D11, the second outer insulation layer D12 and the inner insulation layer D13 can be made of PID material, forming the conductive connection structures P11a and P11b can include laser ablation or lithography.

The conductive connection structures P11a and P11b are electrically connected to the first outer wiring layer W11, the second outer wiring layer W12 and the inner wiring layers W13. Specifically, each of the conductive connection structures P11a is connected to a first pad W11p of the first outer wiring layer W11 and the inner wiring layer W13 that is adjacent to the first outer wiring layer W11, whereas each of the conductive connection structures P11b is connected to a second pad W12p of the second outer wiring layer W12 or two adjacent inner wiring layers W13. Accordingly, the electric current can flow among the first outer wiring layer W11, the second outer wiring layer W12 and the inner wiring layers W13 via the conductive connection structures P11a and P11b.

In the embodiment as shown in FIG. 1B, the conductive connection structures P11a and P11b are all conductive pillars, in which the conductive connection structures P11a can be solid conductive pillars, and the conductive connection structures P11b can be hollow conductive pillars. However, in other embodiment, the conductive connection structures P11a also can be hollow conductive pillars, and the conductive connection structures P11b also can be solid conductive pillars. Alternatively, all of the conductive connection structures P11a and P11b can be solid conductive pillars or hollow conductive pillars. Hence, the conductive connection structures P11a and P11b are not limited as shown in FIG. 1B.

It is worth mentioning that in the present embodiment, the redistribution layer 110 can include at least three wiring layers (i.e., the first outer wiring layer W11, the second outer wiring layer W12 and the inner wiring layers W13) and at least three insulation layers (i.e., the first outer insulation layer D11, the second outer insulation layer D12 and the inner insulation layers D13). However, in other embodiment, the redistribution layer 110 can include only two wiring layers (for example, the first outer wiring layer W11 and the second outer wiring layer W12) and only one insulation layer between the two wiring layers.

Hence, in one single redistribution layer 110, the quantity of the wiring layers (including the first outer wiring layer W11, the second outer wiring layer W12 and the inner wiring layers W13, for example) can be two, and the quantity of the insulation layers (including the first outer wiring layer W11, the second outer wiring layer W12 and the inner wiring layers W13, for example) can be changed to only one, so the quantities of the wiring layers and the insulation layers in the redistribution layer 110 are not limited as shown in FIG. 1B. For example, in other embodiment, the quantity of the inner insulation layer D13 included in the redistribution layer 110 may be one.

The chip package 100 further includes a chip 120, in which the chip 120 is disposed on the first surface F11a of the first outer insulation layer D11, so the first outer insulation layer D11 is located between the chip 120 and the second outer insulation layer D12. The chip 120 may be an unpackaged die or a packaged chip. The chip 120 can be mounted on the first surface F11a and electrically connected to the first pads W11p. In addition, the chip package 100 can be a fan-out packaged structure, in which the size of the chip 120 is smaller than the size of the redistribution layer 110, and the redistribution layer 110 can protrude from the side 121 of the chip 120, as shown in FIGS. 1A and 1B.

In the embodiment shown in FIG. 1B, the chip 120 can be electrically connected to the first pads W11p by flip chip, so that the chip 120 can be electrically connected to the first pads W11p via a plurality of solder bumps S11. In other embodiment, the chip 120 also can be electrically connected to the first pads W11p by wire bonding, so that it is not limited that the chip 120 is connected to the first pads W11p by flip chip.

The chip package 100 further includes an encapsulation member 130, in which the encapsulation member 130 wraps the chip 120 and the redistribution layer 110. The encapsulation member 130 can cover the chip 120 and all of the first surface F11a, the second surface F11b and the side surface F11c of the redistribution layer 110, and the encapsulation member 130 is not flush with the first surface F11a and the side surface F11c. In other words, the length 130L and the width 130W of the encapsulation member 130 are larger than the length 110L and the width 110W of the redistribution layer 110 respectively, so that both the chip 120 and the redistribution layer 110 can be located within the encapsulation member 130.

The encapsulation member 130 can expose the second pads W12p and not cover the first pads W11p completely, so that the solder bumps S11 can be connected to the first pads W11p. In the present embodiment, the chip package 100 can further include a plurality of solder bumps S12. Since the encapsulation member 130 can expose the second pads W12p, the out surface W12s of the second pads W12p can be exposed, so that the solder bumps S12 can be connected to the second pads W12p respectively. Accordingly, the second pads W12p can be electrically connected to the solder bumps S12, so that the chip package 100 can be electrically connected to a wiring substrate, such as a printed wiring board or an electronic carrier, via the solder bumps S12.

The encapsulation member 130 can include a first molding compound 131 and a second molding compound 132, in which the first molding compound 131 is connected to the second molding compound 132, and the materials of both the first molding compound 131 and the second molding compound 132 may be the same or different. The first molding compound 131 covers the chip 120 and the redistribution layer 110, where the first molding compound 131 covers the first surface F11a and the side surface F11c of the redistribution layer 110, but does not cover the second surface F11b. The second molding compound 132 covers the second surface F11b, so the second molding compound 132 also covers the traces 129. The second molding compound 132 exposes the second pads W12p, so that the solder bumps S12 can be connected to the second pads W12p.

Moreover, after the chip 120 is mounted on the first surface F11a, a gap G1 can be formed between the chip 120 and the redistribution layer 110, and the first molding compound 131 can fill the gap G1. In other words, a part of the encapsulation member 130 can fill the gap G1 between the chip 120 and the redistribution layer 110, and the encapsulation member 130 can cover the upper surface, the lower surface and the side 121 of the chip 120, thereby wrapping the whole chip 120, as shown in FIGS. 1A and 1B.

Since the encapsulation member 130 wraps the chip 120 and the redistribution layer 110 and covers both the first surface F11a and the side surface F11c of the redistribution layer 110, the encapsulation member 130 can enhance the structure of the chip package 100 and reduce the chance of breaking the redistribution layer 110, so as to improve the reliability of the chip package 100. Hence, the chip package 100 can have enough strength of structure to withstand the TCT.

Figure 2A:
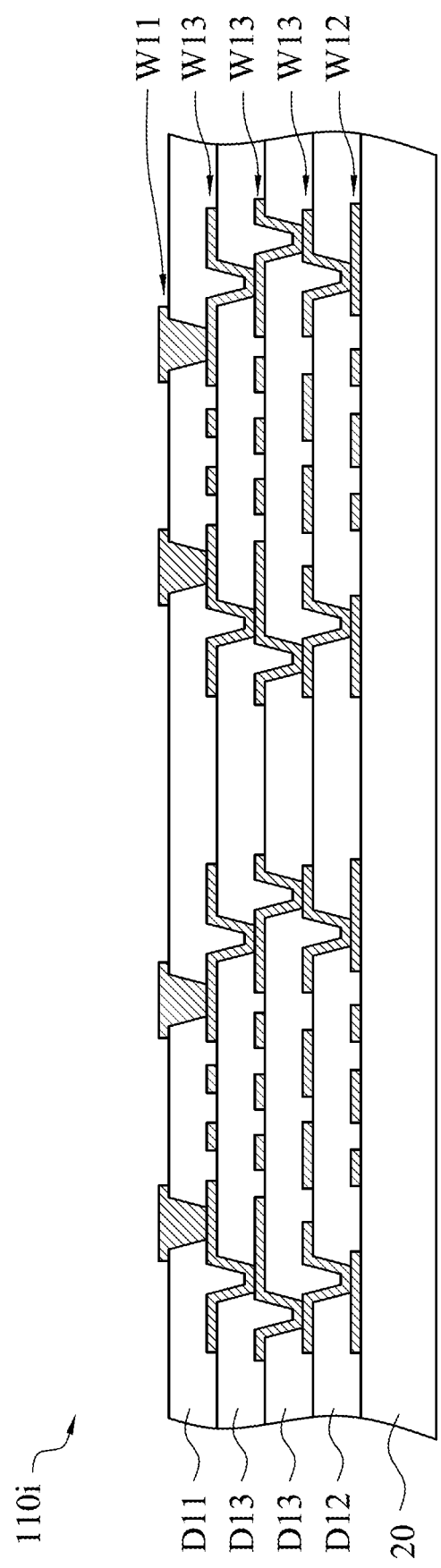
FIGS. 2A to 2G are schematic views of a method of manufacturing the chip package shown in FIG. 1B.

FIGS. 2A to 2G are schematic views of a method of manufacturing the chip package shown in FIG. 1B. Referring to FIG. 2A, in the method of manufacturing the chip package 100, first, an initial redistribution layer 110i is formed on the support substrate 20, in which the initial redistribution layer 110i can be formed by buildup or stackup. The support substrate 20 is used for supporting the initial redistribution layer 110i and can be a rigid substrate, such as a ceramic board or a glass plate.

In a subsequent process, the initial redistribution layer 110i can be diced into a plurality of redistribution layers 110, so the initial redistribution layer 110i can include the plurality of distribution layers 110. In other words, both the initial redistribution layer 110i and the redistribution layer 110 include the same layers and elements, i.e., the first outer insulation layer D11, the second outer insulation layer D12, the inner insulation layers D13, the first outer wiring layer W11, the second outer wiring layer W12, the inner wiring layers W13, and the conductive connection structures P11a and P11b.

Figure 2B:
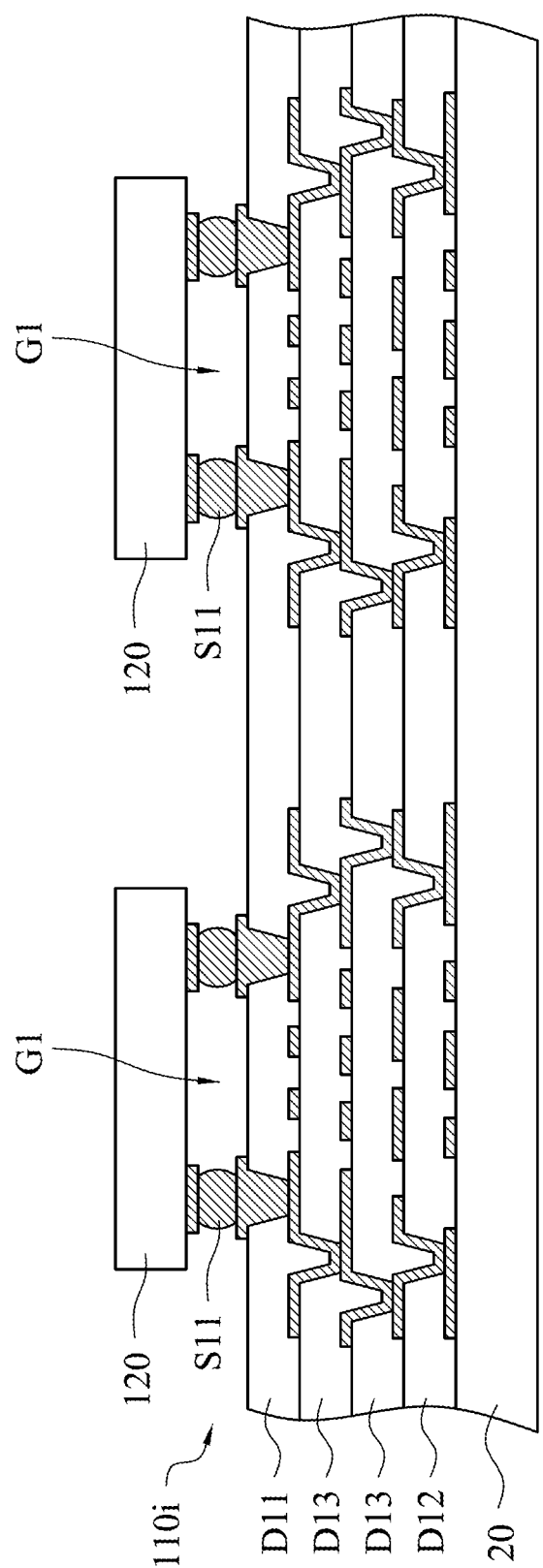

Referring to FIG. 2B, afterward, multiple chips 120 are mounted on the initial redistribution layer 110i. In the present embodiment, the chips 120 can be mounted on the initial redistribution layer 110i by flip chip. That is, the chips 120 can be electrically connected the first pads W11p via the plurality of solder bumps S11. After the chips 120 are mounted on the initial redistribution layer 110i, the gap G1 can be formed between each of the chips 120 and the initial redistribution layer 110i. In other embodiment, the chips 120 also can be mounted on the initial redistribution layer 110i by wire bonding, so that the means of mounting the chip 120 on the initial redistribution layer 110i is not limited to flip chip.

Figure 2C:
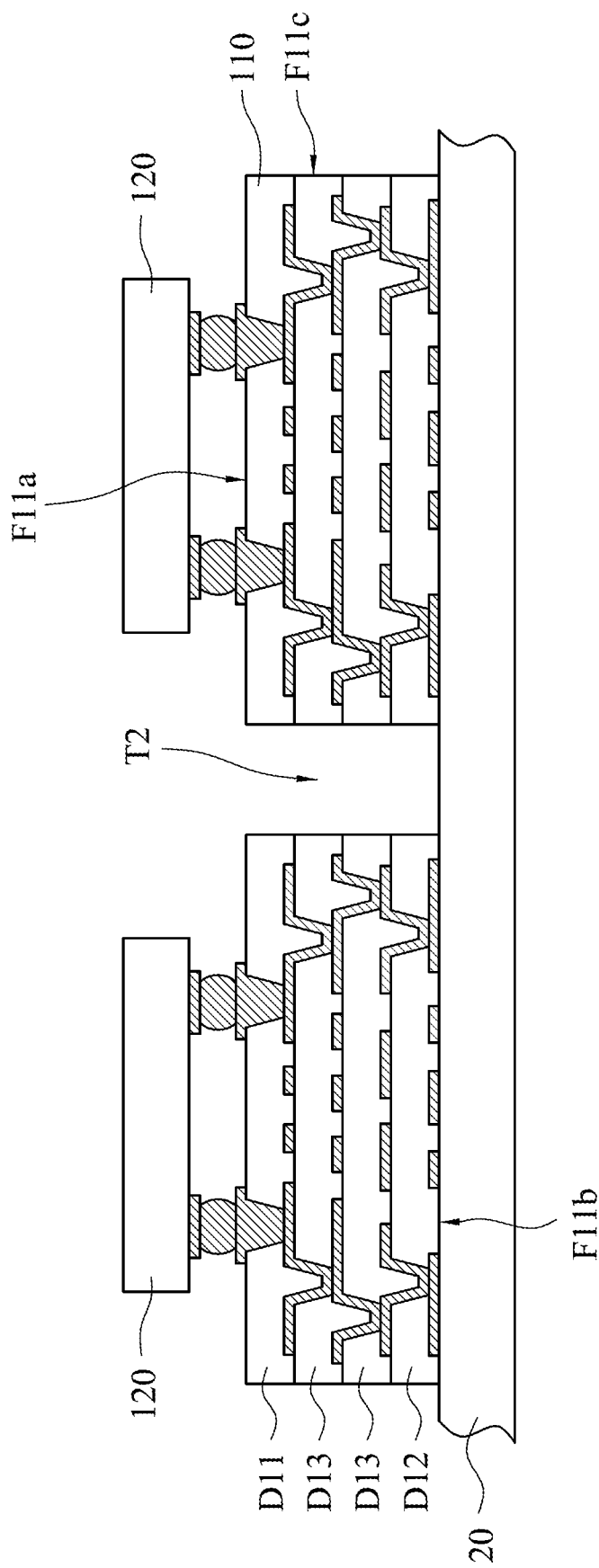
Figure 2D:
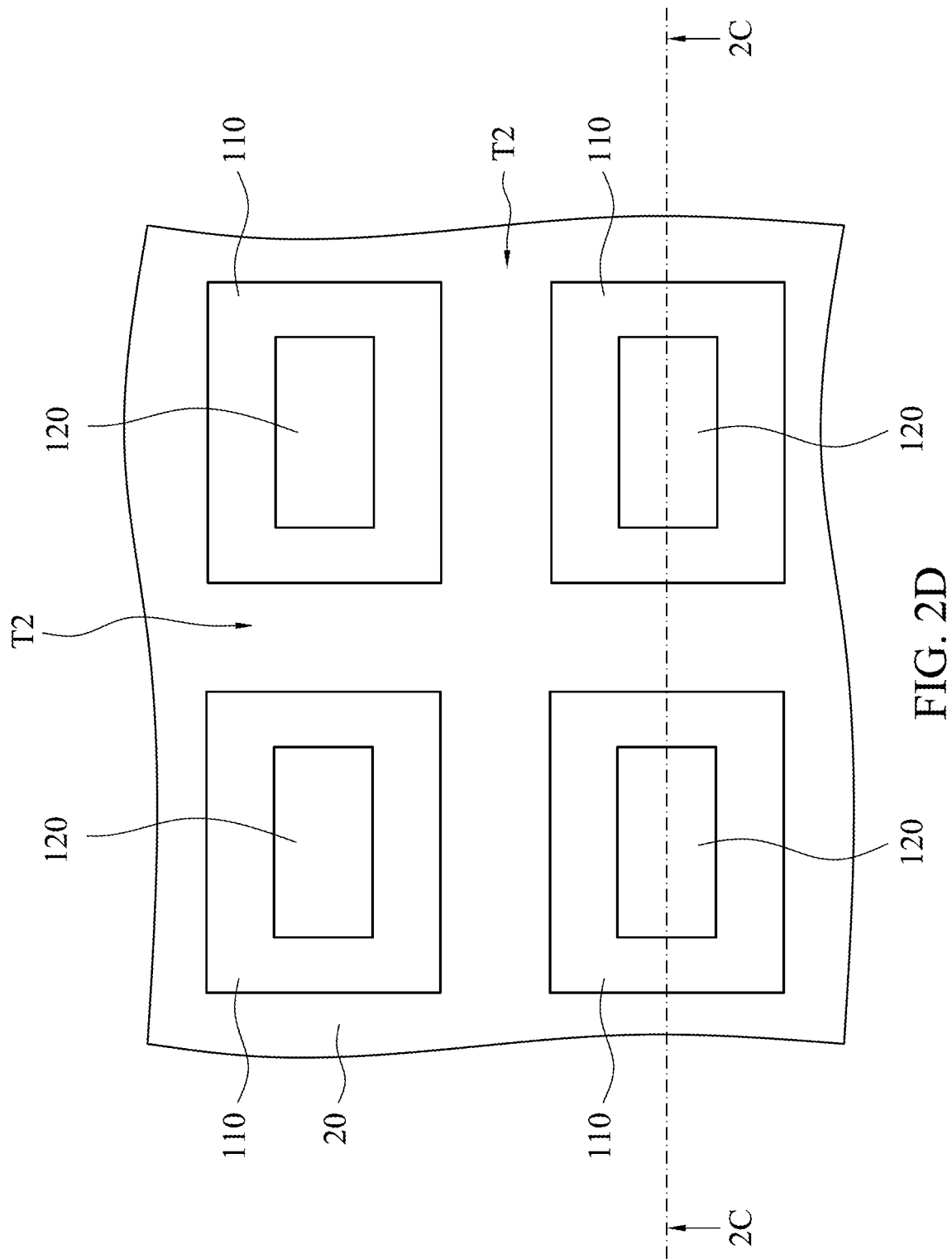

Referring to FIGS. 2C and 2D, FIG. 2D is a schematic top view of the elements, such as the chips 120 and the support substrate 20, depicted in FIG. 2C, and FIG. 2C can be a schematic cross-sectional view along a line 2C-2C in FIG. 2D. Afterward, the initial redistribution layer 110i is diced into the plurality of redistribution layers 110 separated from each other. After the initial redistribution layer 110i is diced, a plurality of trenches T2 will be formed among the redistribution layers 110. The chip 120 can be arranged in an array, while the trenches T2 can be arranged in a mesh, as shown in FIG. 2D. In addition, since the first outer insulation layer D11, the second outer insulation layer D12 and the inner insulation layers D13 can be made of PID material, the means of dicing the initial redistribution layer 110i can be laser ablation or lithography.

Figure 2E:
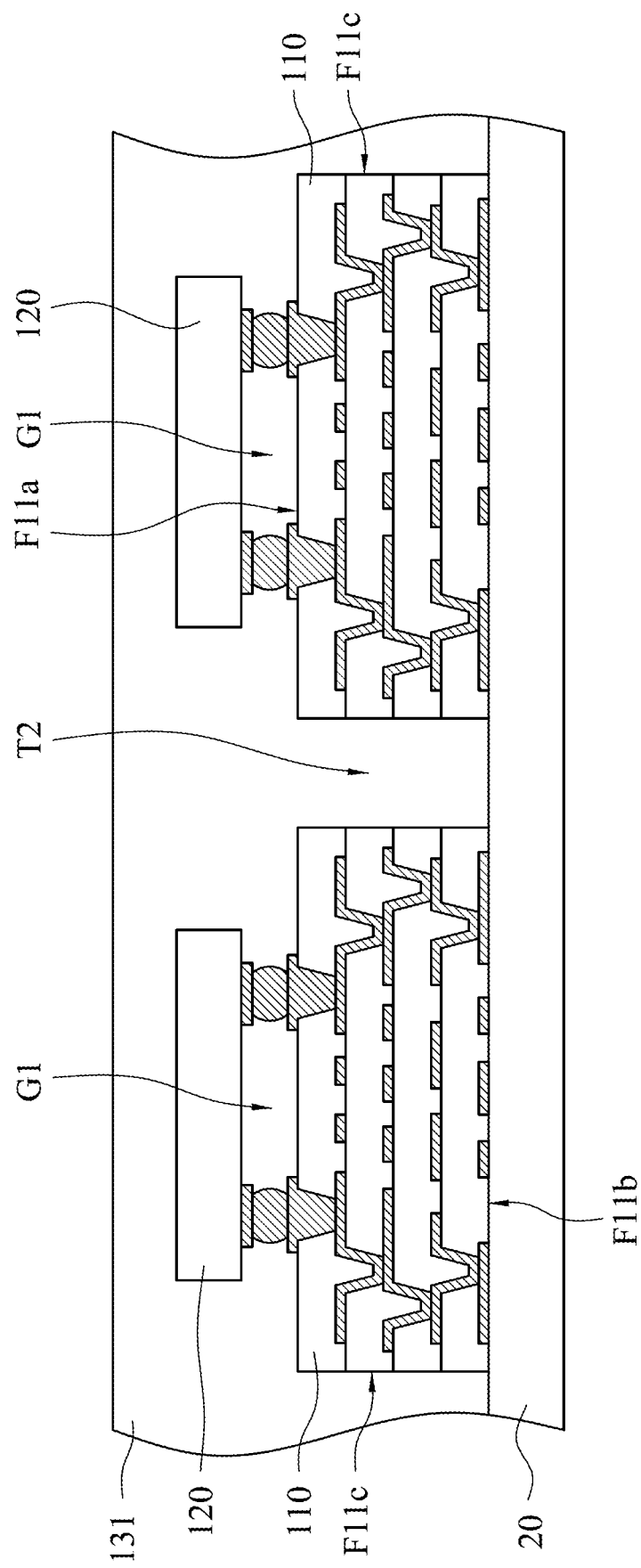
Figure 2F:
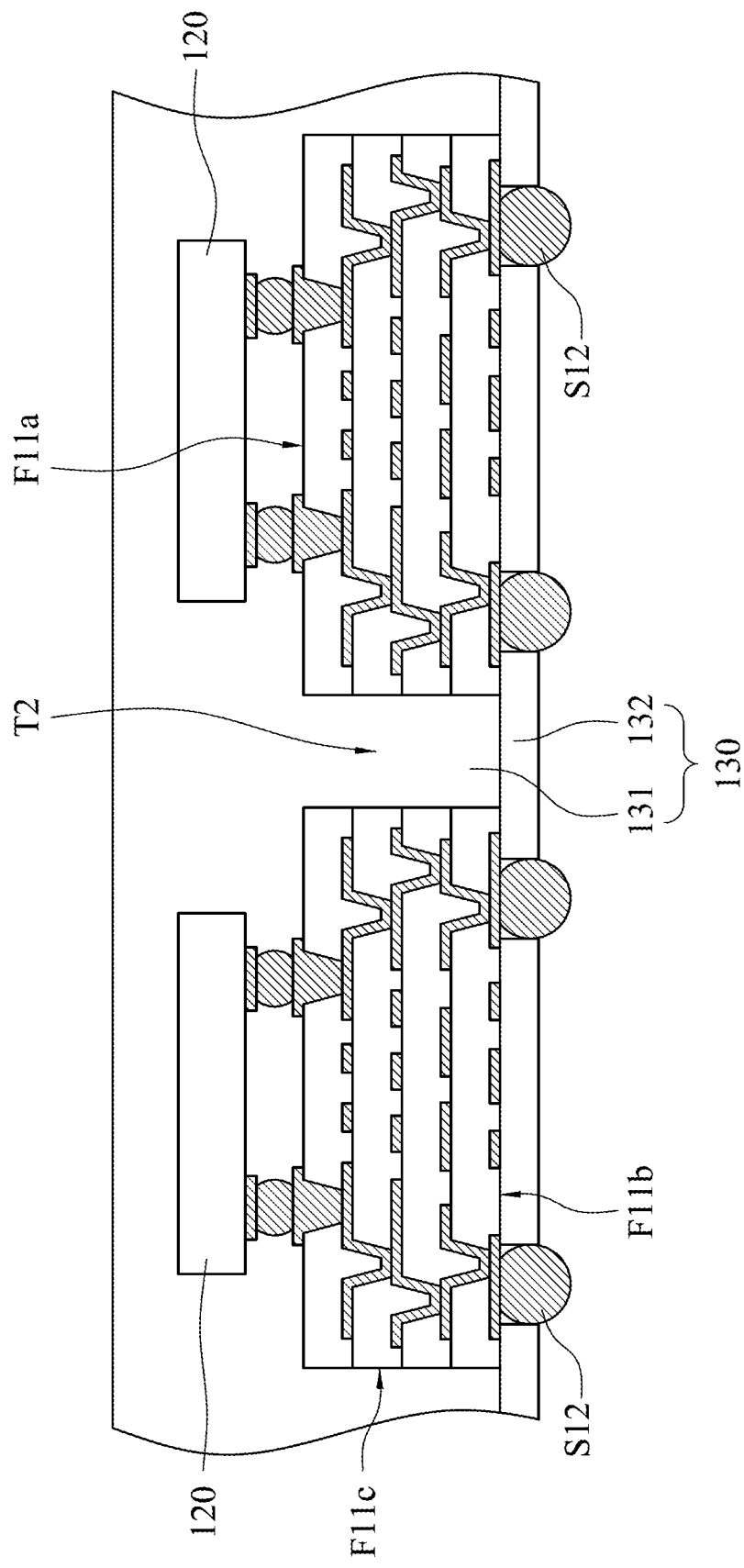

Referring to FIGS. 2E and 2F, afterward, it starts to form the encapsulation member 130. In the present embodiment, the formation of the encapsulation member 130 includes the following steps. Referring to FIG. 2E, first, a first molding compound 131 is formed on the support substrate 20, where the first molding compound 131 fills the trenches T2 and the gaps G1 and covers the chips 120 and both the first surface F11a and the side surface F11c of each of the redistribution layers 110, but does not cover the second surfaces F11b of the redistribution layer 110.

Referring to FIG. 2F, after the first molding compound 131 is formed, the support substrate 20 is removed, so that the second surfaces F11b of the redistribution layer 110 can be exposed. Afterward, a second molding compound 132 is formed on the second surfaces F11b of the redistribution layers 110, in which the second molding compound 132 exposes the second pads W12p. At this time, the encapsulation member 130 is formed. In addition, after the second molding compound 132 is formed, a plurality of solder bumps S12 can be formed on the redistribution layers 110, in which each of the redistribution layers 110 is located between one of the chips 120 and at least two solder bumps S12.

Figure 2G:
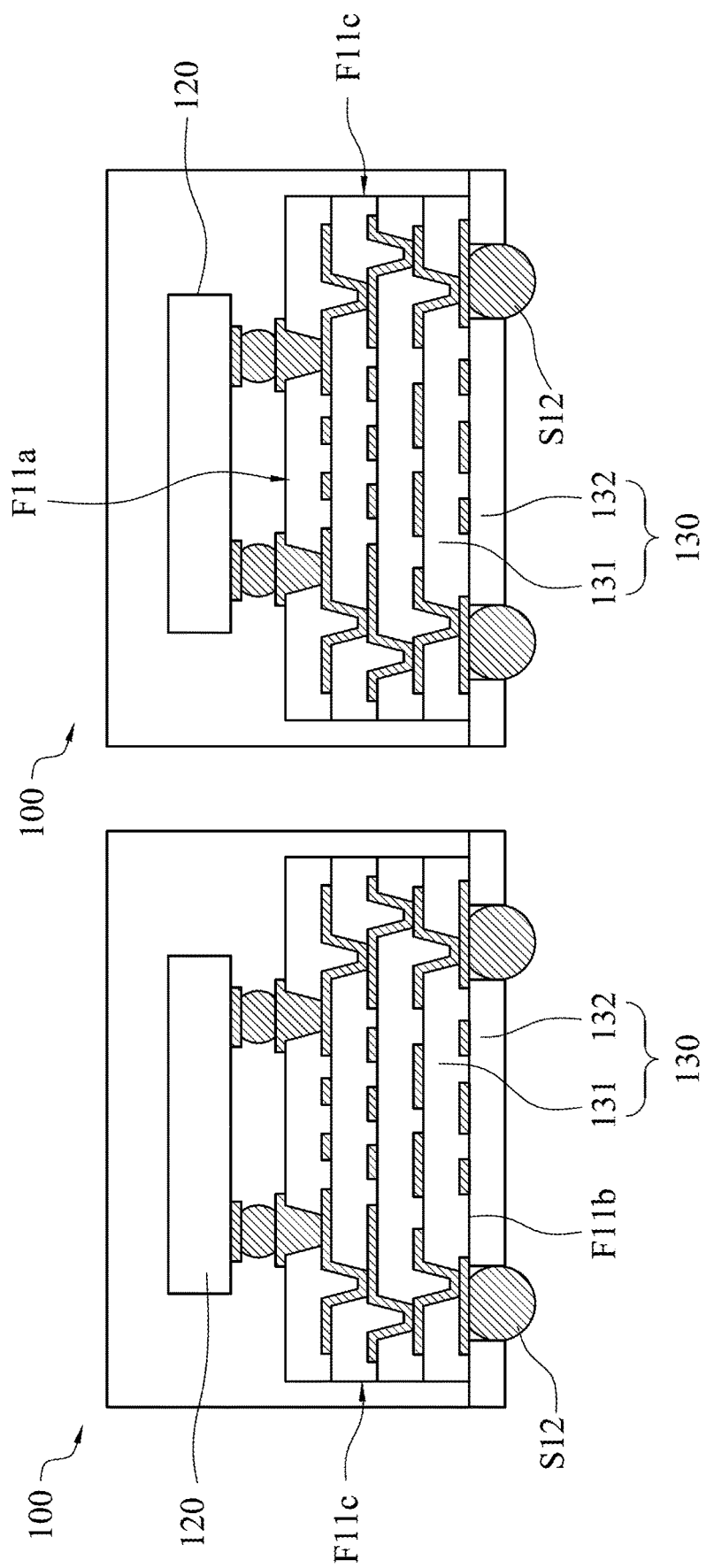

Referring to FIGS. 2F and 2G, afterward, the encapsulation member 130 is diced into a plurality of chip packages 100 separated from each other along the trenches T2. Since the encapsulation member 130 fills the trenches T2 before dicing the encapsulation member 130, the encapsulation member 130 can cover all of the first surface F11a, the side surface F11c and the second surface F11b of the redistribution layer 110 in the same chip package 100 after dicing the encapsulation member 130 along the trenches T2. Accordingly, the encapsulation member 130 of each chip package 100 can wrap the chip 120 and the redistribution layer 110, so as to improve the reliability.

Figure 3A:
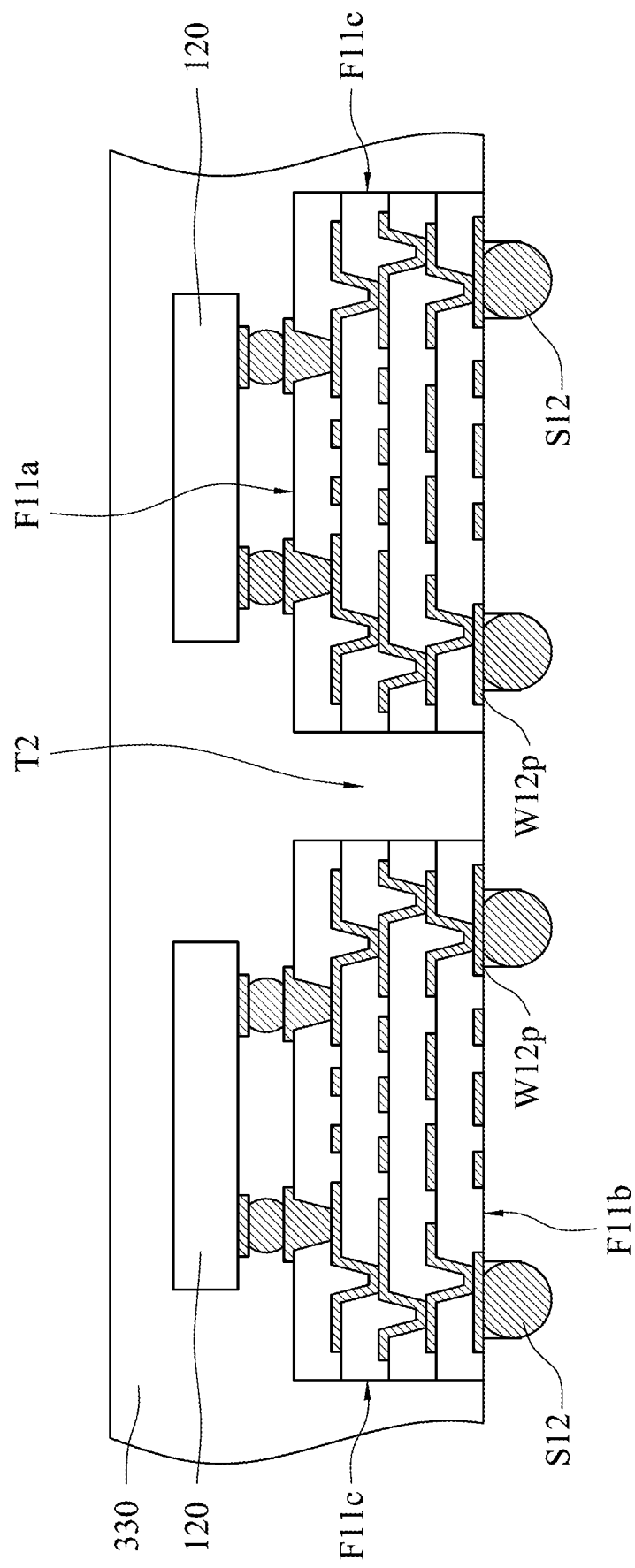
FIGS. 3A and 3B are schematic views of a method of manufacturing a chip package according to another embodiment of this disclosure.
Figure 3B:
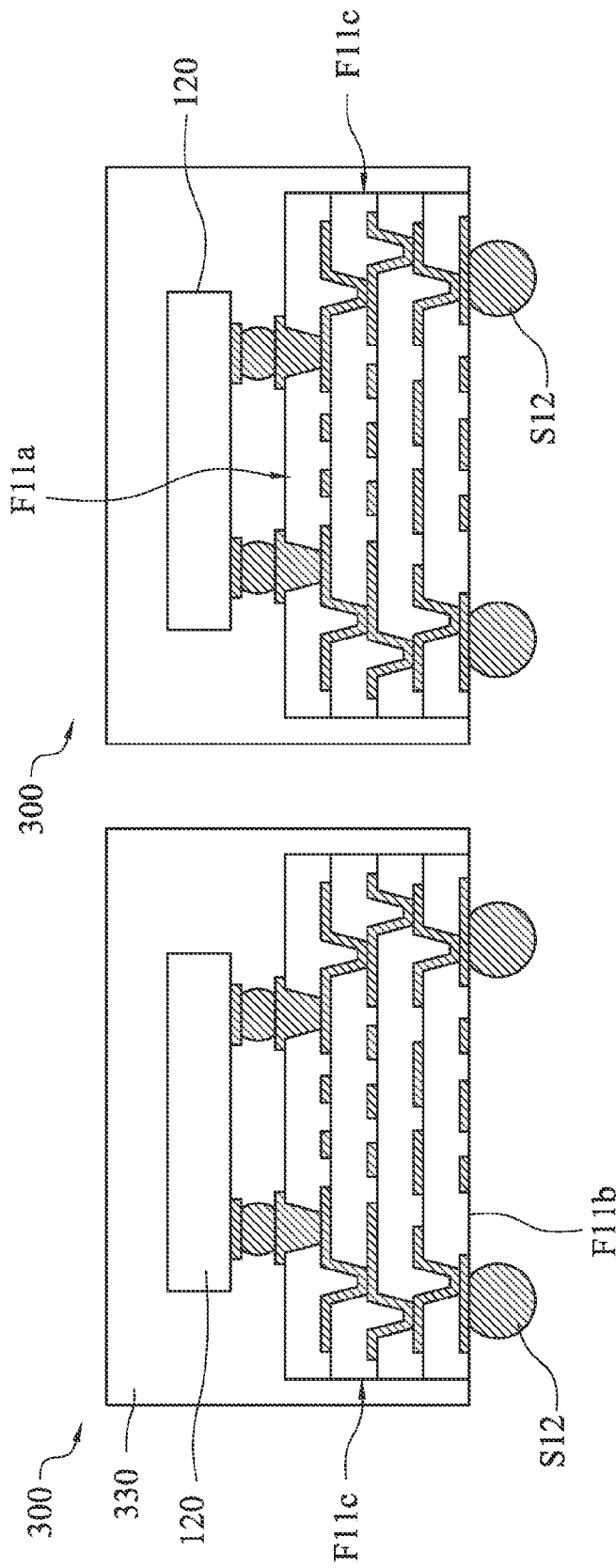

FIGS. 3A and 3B are schematic views of a method of manufacturing a chip package according to another embodiment of this disclosure. Referring to FIGS. 3A and 3B, a method of manufacturing a chip package 300 in the present embodiment is similar to the method of manufacturing the chip package 100 in the previous embodiment. The following description and the drawings mainly disclose the difference between the chip packages 100 and 300, while the same features of the chip packages 100 and 300 are not described again.

Referring to FIG. 3B at first, in contrast to the chip package 100 in the previous embodiment, the chip package 300 includes an encapsulation member 330, in which the encapsulation member 130 wraps the chip 120 and the redistribution layer 110 and covers the chip 120, the first surface F11a and the side surface F11c, but does not cover the second surface F11b. Thus, the encapsulation member 330 also does not cover the second pads W12p. In addition, the encapsulation member 330 can be the first molding compound 131 in the previous embodiment.

Referring to FIG. 3A, after the encapsulation member 330, which may be the first molding compound 131, is formed on the support substrate 20 (referring to FIG. 2E), the support substrate 20 is removed, in which the encapsulation member 330 fills the trenches T2. Next, a plurality of solder bumps S12 are formed on the second pads W12p respectively. Afterward, the encapsulation member 330 is diced into a plurality of chip packages 300 separated from each other along the trenches T2. Therefore, in contrast to the method of manufacturing the chip package 100, the method of manufacturing the chip package 300 substantially skips the formation of the second molding compound 132.

Figure 4A:
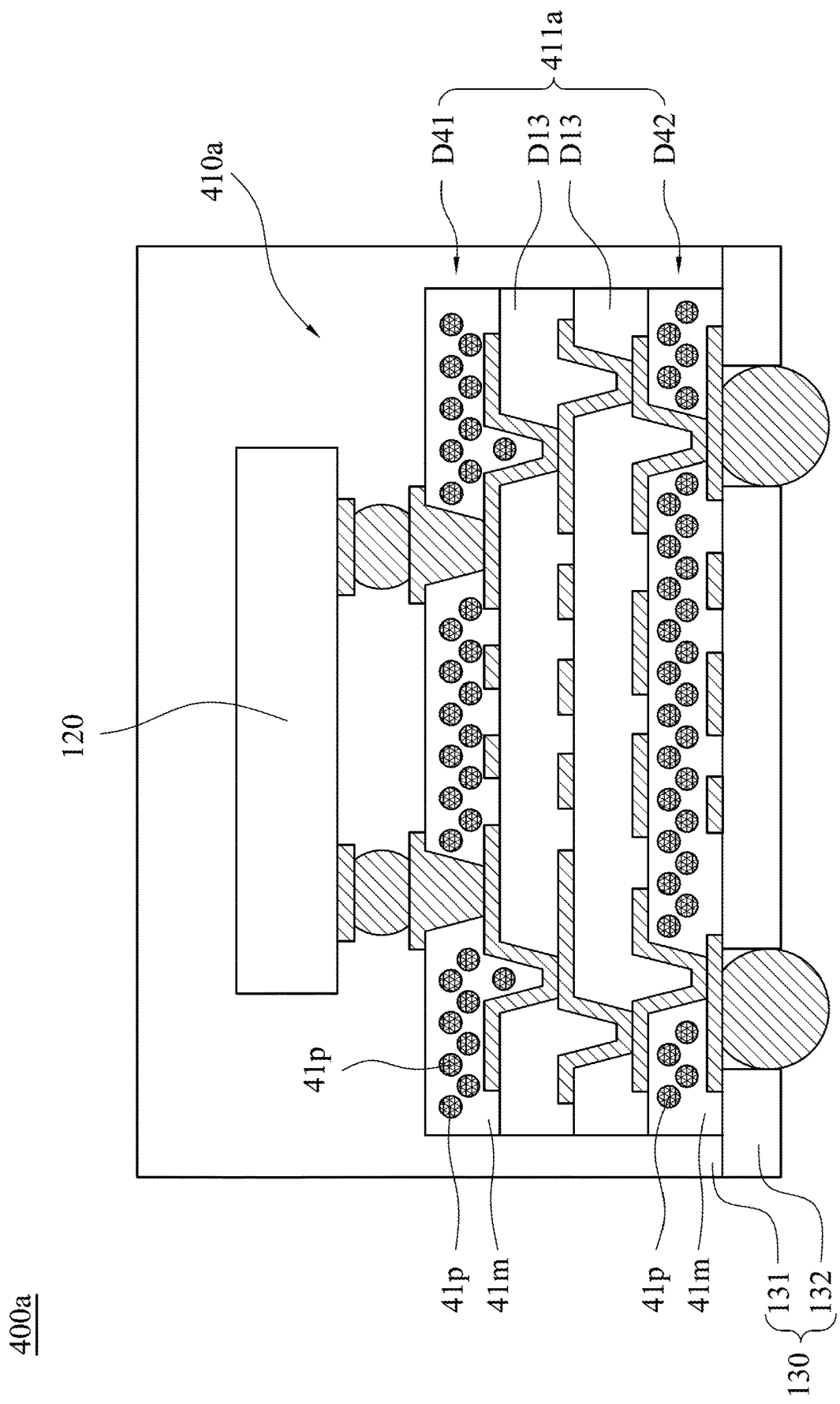
FIG. 4A is a schematic cross-sectional view of a chip package according to another embodiment of this disclosure.

FIG. 4A is a schematic cross-sectional view of a chip package according to another embodiment of this disclosure. Referring to FIG. 4A, the chip package 400a in the present embodiment is similar to the chip package 100 in the previous embodiment. For example, the chip package 400a includes a redistribution layer 410a that includes an insulation part 411a, in which the insulation part 411a can include a first outer insulation layer D41, a second outer insulation layer D42 and a plurality of inner insulation layers D13. However, unlike the chip package 100, the first outer insulation layer D41 and the second outer insulation layer D42 are different from the first outer insulation layer D11 and the second outer insulation layer D12.

Specifically, at least one of the first outer insulation layer D41 and the second outer insulation layer D42 includes an insulation material 41m and a plurality of fillers 41p, where the fillers 41p are distributed in the insulation material 41m. The insulation material 41m may be a polymer material, such as epoxy, polyimide (PI), polybenzoxazole (PBO), benzocyclobutene (BCB) or other material, or any combination of these materials and other material. The fillers 41p can be a plurality of filler particles which can be made of silicon dioxide. By the fillers 41p, at least one of the first outer insulation layer D41 and the second outer insulation layer D42 also can enhance the structure of the chip package 400a to reduce the chance of breaking the redistribution layer 410a, thereby improving the reliability.

It is worth mentioning that in the embodiment as shown in FIG. 4A, each of the first outer insulation layer D41 and the second outer insulation layer D42 includes the insulation material 41m and the fillers 41p. However, in other embodiment, only one of the first outer insulation layer D41 and the second outer insulation layer D42 can include the insulation material 41m and the fillers 41p. Accordingly, in FIG. 4A, the fillers 41p in one of the first outer insulation layer D41 and the second outer insulation layer D42 can be omitted. Alternatively, one of the first outer insulation layer D41 and the second outer insulation layer D42 can be replaced by an insulation layer made of PID material, such as the first outer insulation layer D11 or the second outer insulation layer D12.

Figure 4B:
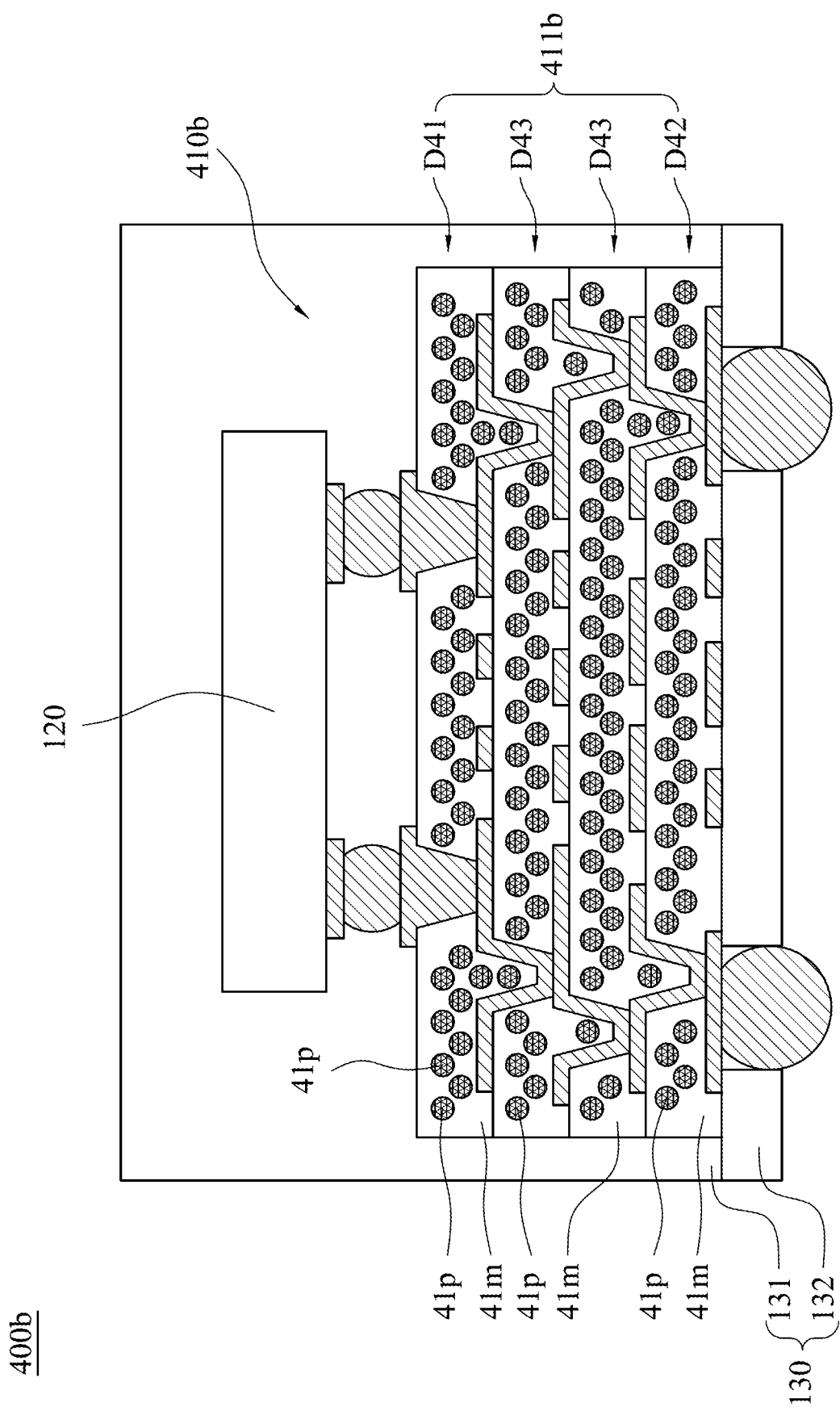
FIG. 4B is a schematic cross-sectional view of a chip package according to another embodiment of this disclosure.

FIG. 4B is a schematic cross-sectional view of a chip package according to another embodiment of this disclosure. Referring to FIG. 4B, the chip package 400b includes a redistribution layer 410b that includes an insulation part 411b, in which the insulation part 411b can include a first outer insulation layer D41, a second outer insulation layer D42 and a plurality of inner insulation layers D43. The chip package 400b is similar to the chip package 400a, and the only difference between the chip packages 400a and 400b is that in the chip package 400b, each of the first outer insulation layer D41, the second outer insulation layer D42 and the inner insulation layers D43 includes the insulation material 41m and the fillers 41p. Thus, the whole insulation part 411b also can enhance the structure of the chip package 400b and reduce the chance of breaking the redistribution layer 410b, thereby improving the reliability.

It is necessary to note that in the embodiment as shown in FIG. 4B, each of the inner insulation layers D43 includes the insulation material 41m and the fillers 41p. However, in other embodiment, at least one of the inner insulation layers D43 includes the insulation material 41m and the fillers 41p. Thus, in FIG. 4B, the fillers 41p in one of the inner insulation layers D43 can be omitted. Alternatively, one of the inner insulation layer D43 can be replaced by an insulation layer made of PID material, i.e., the inner insulation layer D13. In addition, only one of the first outer insulation layer D41 and the second outer insulation layer D42 in FIG. 4B can include the insulation material 41m and the fillers 41p.

Figure 5:
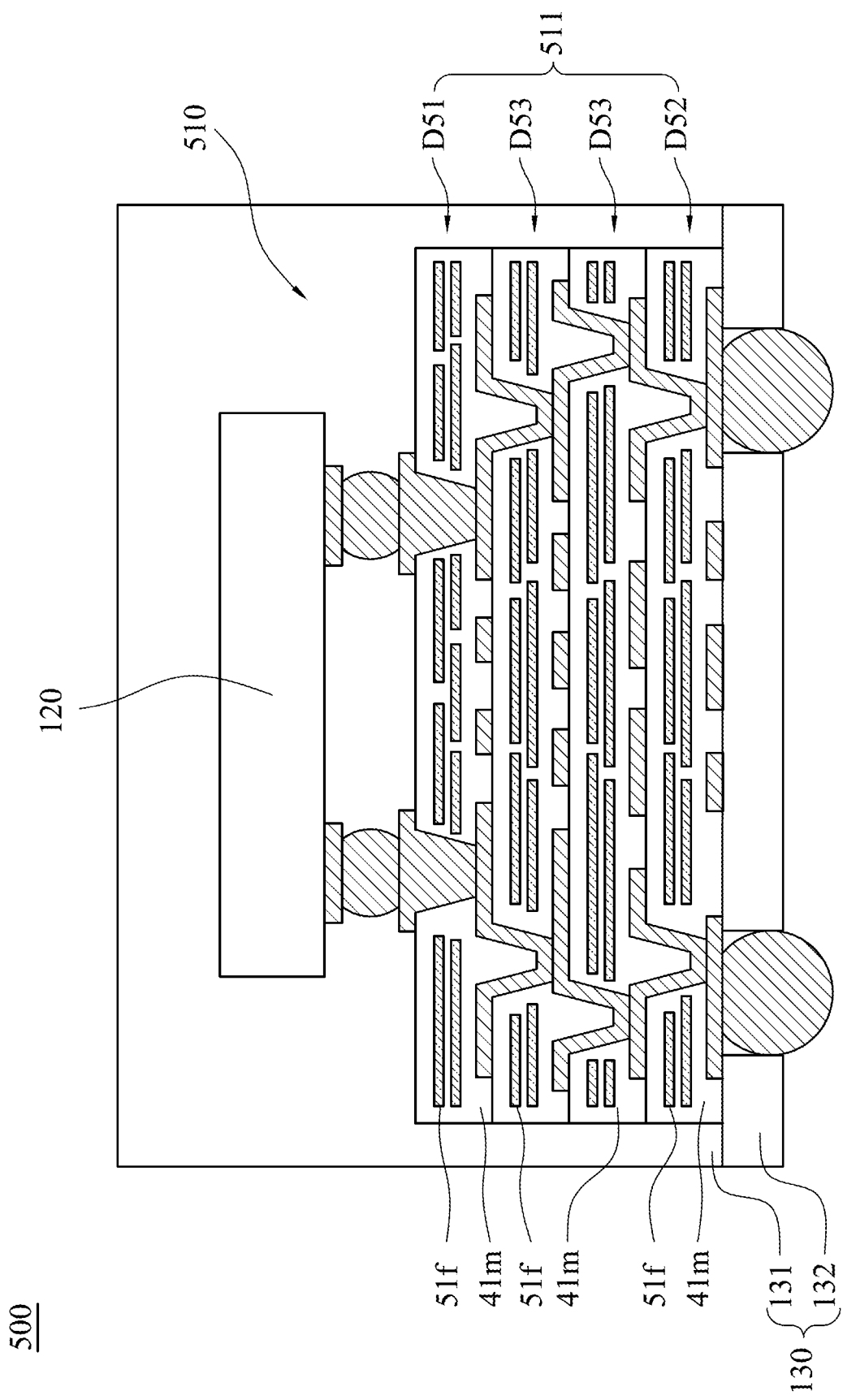
FIG. 5 is a schematic cross-sectional view of a chip package according to another embodiment of this disclosure.

FIG. 5 is a schematic cross-sectional view of a chip package according to another embodiment of this disclosure. Referring to FIG. 5, the chip package 500 of the present embodiment includes a redistribution layer 510 that includes an insulation part 511, in which the insulation part 511 can include a first outer insulation layer D51, a second outer insulation layer D52 and a plurality of inner insulation layers D53. Each of the first outer insulation layer D51, the second outer insulation layer D52 and the inner insulation layers D53 includes an insulation material 41m and a plurality of fillers 51f, in which the fillers 51f are distributed in the insulation material 41m.

The chip package 500 is similar to the chip package 400b, and the only difference between the chip packages 500 and the 400b is that the fillers 51f can be a plurality of filler fibers, where the filler fibers are glass fibers, for example. By the fillers 51f, the whole insulation part 511 also can enhance the structure of the chip package 500 and reduce the chance of breaking the redistribution layer 510, thereby improving the reliability.

It is worth mentioning that in the embodiment as shown in FIG. 5, each of the first outer insulation layer D51, the second outer insulation layer D52 and the inner insulation layers D53 includes the insulation material 41m and the fillers 51f. However, in other embodiment, at least one of the first outer insulation layer D51, the second outer insulation layer D52 and the inner insulation layers D53 can include the insulation material 41m and the fillers 51f.

In other words, in FIG. 5, the fillers 51f in at least one of the first outer insulation layer D51, the second outer insulation layer D52 and the inner insulation layer D53 can be omitted. Alternatively, at least one of the first outer insulation layer D51, the second outer insulation layer D52 and the inner insulation layers D53 can be replaced by an insulation layer made of PID material, i.e., the first outer insulation layer D11, the second outer insulation layer D12 or the inner insulation layer D13.

Moreover, some fillers 51f shown in FIG. 5 can be replaced by the fillers 41p, so that the insulation part 511 can include two fillers 41p and 51f, in which the fillers 51f in at least one of the first outer insulation layer D51, the second outer insulation layer D52 and the inner insulation layers D53 can be replaced by the fillers 41p. In addition, in the chip packages 400a, 400b and 500 shown in FIGS. 4A, 4B and 5, the encapsulation member 130 can be replaced by the encapsulation member 330 shown in FIG. 3B. In other words, the chip package 300 in FIG. 3B can include at least one of the fillers 41p and 51f.

Consequently, since each of the encapsulation members disclosed in the above embodiments wraps the chip and the redistribution layer and covers both the first surface and the side surface of the redistribution layer, the encapsulation member can enhance the structure of the chip package to improve the reliability of the chip package, so that the chip package can have enough strength of structure to withstand the TCT.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A chip package, comprising:
   a redistribution layer, comprising;
      an insulation part, having a first surface, a second surface opposite to the first surface, and a side surface located between the first surface and the second surface;
      an outer wiring layer, located at the insulation part, wherein an outer surface of the outer wiring layer and the second surface are coplanar, and the side surface extends from the first surface to the second surface;
      a plurality of first pads, located at the first surface;
      a plurality of second pads, located at the second surface;
   a chip, disposed on the first surface and electrically connected to the first pads; and
   an encapsulation member, wrapping the chip and the redistribution layer, and completely covering the first surface and the side surface, wherein the encapsulation member exposes the second pads, and the encapsulation member is not flush with the first surface and the side surface, wherein the encapsulation member is made of an electrical insulating material, wherein the encapsulation member is in direct contact with the first surface and exposes the first pads.

2. The chip package of claim 1, wherein the redistribution layer comprises:
a first outer insulation layer, having the first surface; and
a second outer insulation layer, having the second surface, wherein the first outer insulation layer is located between the chip and the second outer insulation layer.

3. The chip package of claim 2, wherein the first outer insulation layer comprises:
an insulation material; and
a plurality of fillers, distributed in the insulation material.

4. The chip package of claim 2, wherein the second outer insulation layer comprises:
an insulation material; and
a plurality of fillers, distributed in the insulation material.

5. The chip package of claim 1, wherein the redistribution layer comprises:
a first outer insulation layer, having the first surface;
a second outer insulation layer, having the second surface, wherein the first outer insulation layer is located between the chip and the second outer insulation layer; and
at least one inner insulation layer, located between the first outer insulation layer and the second outer insulation layer, wherein each of the first outer insulation layer, the second outer insulation layer and the inner insulation layer comprises:
an insulation material; and
a plurality of fillers, distributed in the insulation material.

6. The chip package of claim 3, wherein the chip package, the fillers are a plurality of filler particles or a plurality of filler fibers.

7. The chip package of claim 4, wherein the chip package, the fillers are a plurality of filler particles or a plurality of filler fibers.

8. The chip package of claim 5, wherein the chip package, the fillers are a plurality of filler particles or a plurality of filler fibers.

9. The chip package of claim 1, wherein the encapsulation member does not cover the second surface.

10. The chip package of claim 1, wherein the encapsulation member further covers the second surface.

11. The chip package of claim 1, wherein a part of the encapsulation member fills a gap formed between the chip and the redistribution layer.

12. The chip package of claim 1, further comprising a plurality of solder bumps, wherein the solder bumps are connected to the second pads respectively.

13. The chip package of claim 1, wherein the second surface is flush with an outer surface of each of the second pads.

14. The chip package of claim 1, wherein a length and a width of the encapsulation member are larger than a length and a width of the redistribution layer respectively.

* * * * *